United States Patent
Mehta et al.

(10) Patent No.: US 10,050,189 B2
(45) Date of Patent: Aug. 14, 2018

(54) METHOD OF SYNTHESIZING BISMUTH-ANTIMONY SELENO-TELLURIDE NANOCRYSTALS

(71) Applicant: ThermoAura Inc., Albany, NY (US)

(72) Inventors: Rutvik J. Mehta, Colonie, NY (US); Douglas Y. Desario, Albany, NY (US); Alexander O'Toole, Troy, NY (US)

(73) Assignee: ThermoAura Inc., Albany, NY (US)

( * ) Notice: Subject to any disclaimer, the term of this patent is extended or adjusted under 35 U.S.C. 154(b) by 0 days.

(21) Appl. No.: 15/335,736

(22) Filed: Oct. 27, 2016

(65) Prior Publication Data
US 2017/0133569 A1    May 11, 2017

Related U.S. Application Data

(63) Continuation of application No. PCT/US2016/057886, filed on Oct. 20, 2016.
(Continued)

(51) Int. Cl.
| | | |
|---|---|---|
| *C01B 19/00* | (2006.01) | |
| *H01L 35/26* | (2006.01) | |
| *H01L 35/34* | (2006.01) | |
| *H01L 35/18* | (2006.01) | |
| *H01L 35/16* | (2006.01) | |

(52) U.S. Cl.
CPC ............ *H01L 35/26* (2013.01); *C01B 19/007* (2013.01); *H01L 35/16* (2013.01); *H01L 35/18* (2013.01); *H01L 35/34* (2013.01); *C01P 2006/32* (2013.01); *C01P 2006/40* (2013.01)

(58) Field of Classification Search
CPC . B01J 19/12; C04B 35/64; C09K 5/00; B82Y 40/00
See application file for complete search history.

(56) References Cited

U.S. PATENT DOCUMENTS

| | | | |
|---|---|---|---|
| 4,374,758 A * | 2/1983 | Sasaki | B01J 23/24 |
| | | | 423/508 |
| 8,524,362 B2 | 9/2013 | Ramanath et al. | |
| 2013/0234079 A1* | 9/2013 | Rowe | C04B 35/547 |
| | | | 252/519.4 |

FOREIGN PATENT DOCUMENTS

CN    101503176 A    8/2009

OTHER PUBLICATIONS

Dong, Guo-Hui, Ying-Jie Zhu, and Li-Dong Chen. "Microwave-assisted rapid synthesis of Sb2Te3 nanosheets and thermoelectric properties of bulk samples prepared by spark plasma sintering." Journal of Materials Chemistry 20.10 (2010): 1976-1981.*

(Continued)

*Primary Examiner* — Richard M Rump
(74) *Attorney, Agent, or Firm* — Hoffman Warnick LLC

(57) ABSTRACT

A first aspect of the disclosure provides for method of synthesizing bismuth-antimony seleno-telluride thermoelectric nanocrystals. The method may comprise: synthesizing an oxidative chalcogen precursor, the synthesizing including: dissolving a metal in acidic deionized water by reacting the metal with a caustic solution in the deionized water to synthesize a first solution, and adjusting at least one of: pH level or a pE level of the first solution; exposing the oxidative chalcogen precursor to a pnictogen precursor to create nanoseeds; and subjecting the nanoseeds to a microwave thereby synthesizing the bismuth-antimony seleno-telluride thermoelectric nanocrystals.

24 Claims, 3 Drawing Sheets

Related U.S. Application Data

(60) Provisional application No. 62/253,897, filed on Nov. 11, 2015.

(56) References Cited

OTHER PUBLICATIONS

Mehta, Rutvik J., et al. "A new class of doped nanobulk high-figure-of-merit thermoelectrics by scalable bottom-up assembly." Nature materials 11.3 (2012): 233.*

Kim, Cham, et al. "Development of bismuth tellurium selenide nanoparticles for thermoelectric applications via a chemical synthetic process." Materials Research Bulletin 46.3 (2011): 407-412.*

Zhu, Lei, et al. "Sonophotocatalytic Performance of $Bi_2Se_3$-Graphene/$TiO_2$ Hybrid Nanomaterials Synthesized with a Microwave-assisted Method." Journal of the Korean Ceramic Society 51.3 (2014): 162-169.*

PCT Search Report for PCT Application No. PCT/US2016/057886 dated Jan. 25, 2017, 13 pages.

* cited by examiner

METHOD OF SYNTHESIZING BISMUTH-ANTIMONY SELENO-TELLURIDE NANOCRYSTALS

CROSS-REFERENCE TO RELATED APPLICATION

This application is a Continuation of Application No. PCT/US16/57886, filed 20 Oct. 2016, which claims the benefit of U.S. Provisional Application No. 62/253,897, filed 11 Nov. 2015, which is hereby incorporated herein by reference in its entirety.

This invention was made with Government support under award numbers 1215307 and 1330650 awarded by the National Science Foundation. The Government has certain rights to this invention.

BACKGROUND

Technical Field

The present disclosure relates to thermoelectric materials, and more specifically, bismuth-antimony seleno-telluride thermoelectric nanocrystals and methods of forming the same.

Related Art

Thermoelectric devices are a promising but largely unrealized technology to improve energy efficiency by scavenging the latent energy in waste-heat across a wide range of applications. While small-scale devices for both Peltier cooling and Seebeck electricity generators have carved out niches in the marketplace, wide-spread adoption hinges on improving the conversion efficiencies (i.e., figure-of-merit ZT) of thermoelectric materials at or below current state-of-the-art material prices. Pnictogen chalcogenide ($Sb_{2-x}Bi_xSe_{3-y}Te_y$) semiconductors are a widely-researched material and the current industry standard for making thermoelectric devices for applications from near room-temperature to medium temperatures up to 350° C. Nanostructured versions of the pnictogen chalcogenides are crucial for performance breakthroughs. However, current industrial-scale synthetic techniques for nanostructures rely on energy-intensive melt-spinning and/or ball-milling to produce the materials. Solution-phase synthesis of nanocrystalline bismuth telluride ($Bi_2Te_3$) and related phases are known, but their scalability is hindered by solvent choice, expensive precursors, extreme pH conditions, difficult preparation/separation/cleaning steps, or some combination of the above.

A polyol-based microwave technique has been used to successfully synthesize nanoplates with excellent thermoelectric properties. This batch process starts with the separate preparations of the pnictogen and chalcogen precursors in a high-boiling organic solvent, which are then mixed and subjected to microwave irradiation. The microwaves activates the reaction between the precursors, and the resulting sulfur-doped $Sb_{2-x}Bi_xSe_{3-y}Te_y$ alloys reached ZT values of greater than 1.1. However, this procedure proved unfeasible to scale due to the cost of the n-octylphosphine-chalcogen precursors, difficult handling of high-boiling solvents and issues disposing of the solvent wastes.

FIG. 1 shows a Pourbaix diagram of tellurium (Te). As shown, tellurium is predominantly insoluble in aqueous solutions and exists as either the element or as an oxide. In reducing environments, tellurium can be reduced to telluride or ditelluride. While soluble reduced tellurium has been used successfully to form $Sb_2Bi_xSe_{3-y}Te_y$ alloys, scaling the reaction to industrial volumes is challenging as a consequence of the limited stability of aqueous precursors containing divalent tellurium. Tellurides are only thermodynamically stable outside the range of water stability; tellurides will gradually oxidize back to more stable forms even in controlled environments. On exposure to air, a film of grey tellurium metal is immediately formed. This degradation of the soluble precursor is not amenable to large-scale production. Furthermore, in order to completely reduce the tellurium, a large quantity of hydride-class reducing agents are necessary, significantly adding to the cost of the reaction and to the amount of alkali impurities present in solution which are known to dramatically lower the Seebeck coefficient (a) of bismuth telluride alloys by increasing the carrier concentration ($n_i$).

FIG. 2 shows a Pourbaix diagram of selenium (Se). Selenium (Se) cannot be oxidized to a soluble compound using hydrogen peroxide at any pH level, although the Pourbaix diagram in FIG. 2 indicates that it should be thermodynamically possible. This suggests that the selenium (Se) oxidation is kinetically unfavorable. Furthermore, similar to the chemistry of tellurium, in order to completely reduce the selenium, a large quantity of hydride-class reducing agents are necessary, significantly adding to the cost of the reaction and to the amount of alkali impurities present in solution which are known to dramatically lower the Seebeck coefficient (a) of bismuth telluride alloys by increasing the carrier concentration ($n_i$).

SUMMARY

A first aspect of the disclosure provides for method of synthesizing bismuth-antimony seleno-telluride thermoelectric nanocrystals. The method may comprise: synthesizing an oxidative chalcogen precursor, the synthesizing including: dissolving a metal in acidic deionized water by reacting the metal with a caustic solution in the deionized water to synthesize a first solution, and adjusting at least one of: a pH level or a pE level of the first solution; exposing the oxidative chalcogen precursor to a pnictogen precursor to create nanoseeds; and subjecting the nanoseeds to a microwave thereby synthesizing the bismuth-antimony selenotelluride thermoelectric nanocrystals.

A second aspect of the disclosure provides for method of synthesizing bismuth-antimony seleno-telluride thermoelectric nanocrystals. The method may comprise: synthesizing an oxidative chalcogen precursor, the synthesizing including: dissolving a metal in acidic deionized water by reacting the metal with hydrogen peroxide in the deionized water to synthesize a first solution, the metal including at least one of: tellurium, selenium or a tellurium or selenium oxide, and adjusting at least one of a pH level or a pE level of the first solution; exposing the oxidative chalcogen precursor to a pnictogen precursor to create nanoseeds; and subjecting the nanoseeds to a microwave thereby synthesizing the bismuth-antimony seleno-telluride thermoelectric nanocrystals.

BRIEF DESCRIPTION OF THE DRAWINGS

These and other features of this invention will be more readily understood from the following detailed description of the various aspects of the invention taken in conjunction with the accompanying drawings that depict various embodiments, in which.

DETAILED DESCRIPTION

The present disclosure relates to thermoelectric materials, and more specifically, bismuth-antimony seleno-telluride thermoelectric nanocrystals and methods of forming the same.

Pnictogen chalcogenide ($Sb_{2-x}Bi_xSe_{3-y}Te_y$) semiconductors are a widely-researched material and the current industry standard for thermoelectric applications. Nanostructured pnictogen chalcogenides are crucial to performance breakthroughs. However, current industrial-scale nanostructure synthetic techniques rely on energy-intensive melt-spinning and/or ball-milling to produce the materials. Solution-phase syntheses of nanocrystalline bismuth telluride ($Bi_2Te_3$) and related phases are known, but their scalability is hindered by solvent choice, expensive precursors, extreme pH conditions, difficult preparation/separation/cleaning steps, or some combination of the above. Pnictogen and chalcogen precursors must have a matched design to be compatible with a batch-flow or continuous process; they must be comparable in terms of concentration, individually stable of a minimum of several hours, but react immediately upon mixing in a microwave field to form nanoseeds that will grow to nanocrystals upon microwave irradiation. The present disclosure provides for the formation of soluble chalcogen precursors that combine with pnictogen precursors for in-situ reduction to produce an entire range of n-type and p-type binary, ternary, and quaternary bismuth telluride-bismuth selenide-antimony telluride nanocrystal alloys represented as $Sb_{2-x}Bi_xSe_{3-y}Te_y$.

Figure 1:
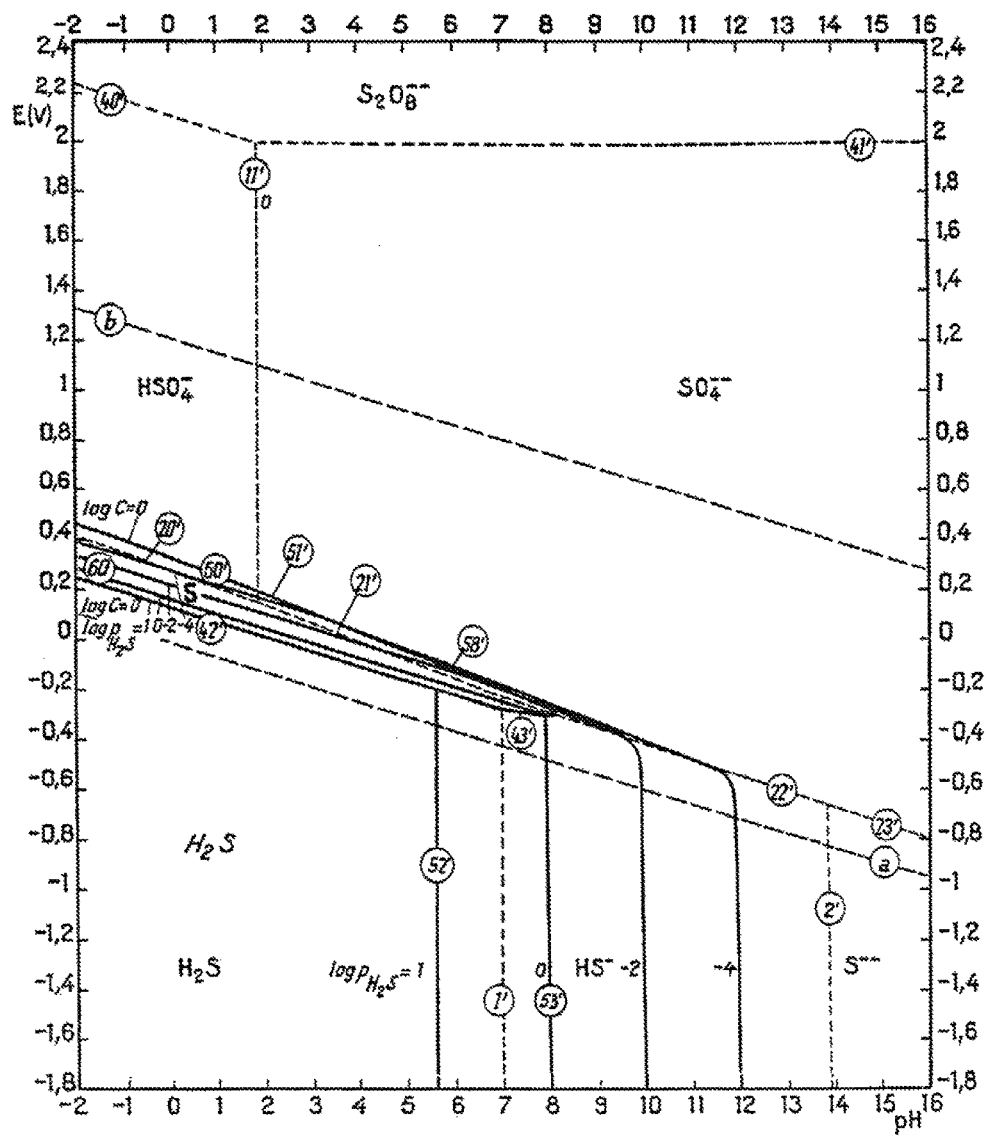
FIG. 1 shows a conventional Pourbaix diagram of tellurium in water.
Figure 2:
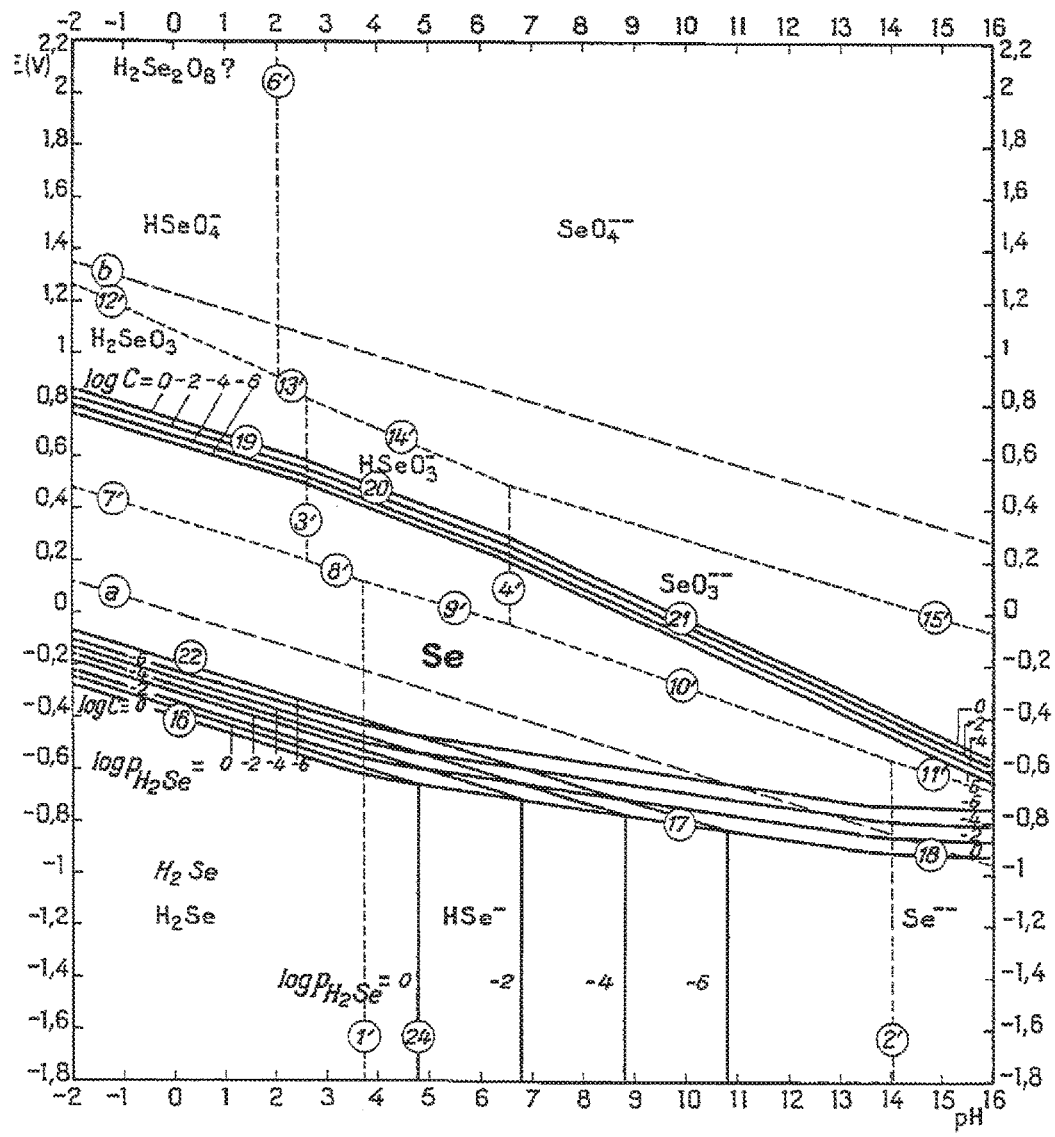
FIG. 2 shows a conventional Pourbaix diagram of selenium in water.
Figure 3:
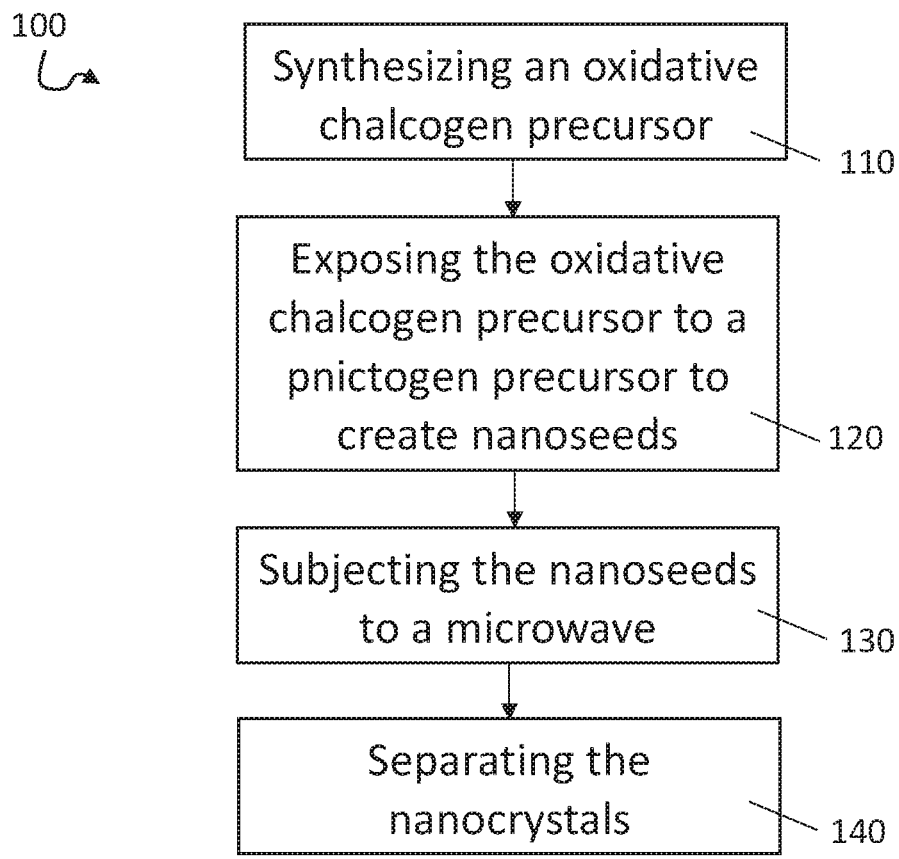
FIG. 3 shows a flow chart of a method according to an aspect of the disclosure.
Figure 4:
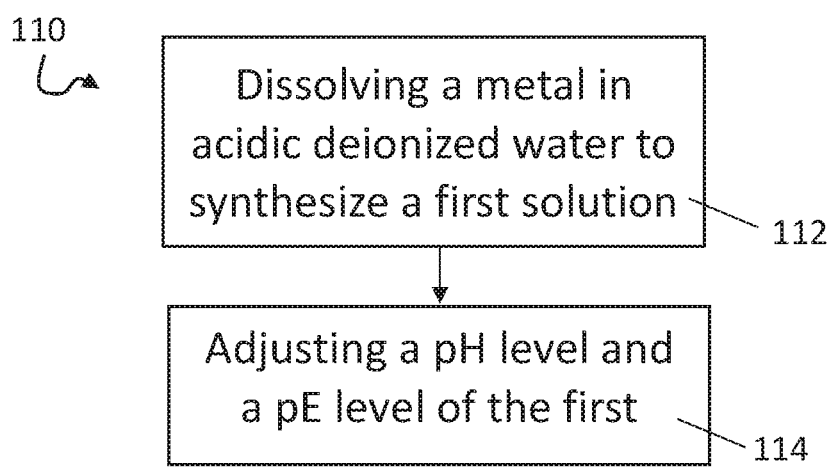
FIG. 4 shows a flow chart of the step of synthesizing an oxidative chalcogen precursor.

One aspect of the disclosure provides for a method of synthesizing bismuth-antimony seleno-telluride thermoelectric nanocrystals. FIG. 3 shows a flow chart of a method 100 according to an aspect of the disclosure. FIG. 4 shows a flow chart of an embodiment of the step 110 of synthesizing an oxidative chalcogen precursor. Referring to FIGS. 3-4 together, a first step 110 of method 100 may include synthesizing an oxidative chalcogen precursor. As known in the art, "chalcogen(s)" refer to chemical elements located in group 16 of the periodic table. In the present disclosure, as shown in FIG. 4, the synthesis of the oxidative chalcogen precursor may include a step 112 of dissolving a metal in acidic deionized water. The metal may include at least one of: tellurium, selenium, or oxides thereof. In some embodiments, the metal may include at least one of: tellurium, tellurium dioxide, tellurous acid, telluric acid, sodium tellurate, selenium, selenous acid, selenic acid or selenium oxide. As discussed herein, group 16 metals are predominantly insoluble in aqueous solutions and exist either as the element, i.e., the metal itself, or as an oxide. While reduced group 16 metals have been successfully dissolved in aqueous solutions, current processes are typically quite difficult to scale to industrial volumes. Therefore, dissolving the metal in acidic deionized water according to the present disclosure includes reacting the metal with a caustic solution in the deionized water to synthesize a first solution. The caustic solution may include, e.g., hydrogen peroxide. In some embodiment, this step may include providing at least 20% excess of the caustic solution relative to the first solution.

Further, step 110 of synthesizing the oxidative chalcogen precursor may include a step 114 of adjusting at least one of: a pH level or a pE level of the first solution. The adjusting the pH level and/or the pE level of the first solution may include reacting the first solution with at least one of: sodium hydroxide, potassium hydroxide, a pyridine, an amine, or ammonium hydroxide. As known in the art, "pH" refers to a value expressing the acidity or alkalinity of a solution on a logarithmic scale of 0 to 14. According to the pH scale, 7 is neutral, while lower values are more acidic and higher values are more alkaline. The pH level of the first solution may be adjusted to approximately 4.5 to approximately 6.5 to form the oxidative precursor and conduct the oxidation reaction. As known in the art, "pE" refers to a reduction potential of a species. Reduction potential can be defined as a measure of the tendency of a chemical species to acquire electrons and thereby be reduced. The more positive the reduction potential of a given species, the greater affinity for electrons and the tendency to be reduced for that given species. The pE level of the first solution may be adjusted to approximately 10 millivolts (mV) to approximately 35 mV. As used herein "approximately" is intended to include values, for example, within 10% of the stated value or values. The adjusting of the pE level of the first solution may include dissolving a reducing agent in the first solution by adjusting the pH level of the first solution a second time to greater than 11 using at least one of: sodium hydroxide, potassium hydroxide, a pyridine, an amine, or ammonium hydroxide. The reducing agent may include a metal hydride, e.g., sodium hydride, lithium hydride, and aluminum hydride or a metal borohydride, e.g., sodium borohydride, potassium borohydride, lithium borohydride, and aluminum borohydride or borohydride derivatives e.g., sodium triethylborohydride. Controlling the pH level and/or the pE level in this manner prevents the metal from precipitating out as an oxide or reduced species. Specifically, combining the reducing agent with the metal in water may destabilize and reduce and precipitate the metal rendering it ineffective as a chalcogen precursor. This tuning of the pH level and/or pE level provides for a stable oxidative chalcogen precursor which can be combined with a pnictogen precursor in a microwave environment as will be described herein.

After the oxidative chalcogen precursor is synthesized, method 100 may include a step 120 of exposing the oxidative chalcogen precursor to a pnictogen precursor to create pnictogen chalcogenide nanoseeds. The pnictogen precursor may include at least one or both of: bismuth or antimony. In some embodiments, the pnictogen precursor may also include thioglycolic acid, i.e., 2-sulfanylacetic acid. The oxidative chalcogen precursor may be exposed to the pnictogen precursor in a reducing, basic environment. In this environment, the reaction to form pnictogen chalcogenide nanoseeds is nearly instantaneous due to the specific reaction pathway that is caused by the tuning of the pH level and/or pE level as discussed herein. When paired with a highly acidic, weakly-reducing pnictogen precursor, the weakly-acidic peroxide-based chalcogen precursor is not sufficiently reducing to directly form the pnictogen chalcogenide nanocrystal at any microwave energy dose. The growth of the pnictogen chalcogenide nanoseeds is stimulated by a step 130 including subjecting the pnictogen chalcogenide nanoseeds to a microwave. The pnictogen chalcogenide nanoseeds may grow to a nanocrystal particle size of approximately 5 nanometers (nm) to approximately 100 nm. The pnictogen chalcogenide nanoseeds may be subjected to a microwave energy dose of approximately equal to or greater than 2.5 kilojoules per gram (KJ/g). The microwave energy dosage may be subjected via a single-mode or multi-mode microwave cavity in a batch or continuous-flow process. A multi-mode microwave cavity has multiple modes of microwave energy which constructively and destructively interfere and consists of traveling electromagnetic wave whereas a single-mode microwave cavity has a single-mode of microwave energy and is characteristically a standing electromagnetic wave.

The peroxide-based chalcogen precursor requires the addition of a reducing agent to lower the solution potential to be sufficiently reducing. While the reducing agent can be added ex-situ, the present disclosure utilizes a chemical procedure for in-situ reducing agent incorporation in the peroxide-based precursor as described herein. By tuning the pH level of the precursor to highly alkaline at pH level of approximately 11 or greater in concentrated hydrogen peroxide solutions, alkali hydrides and borohydrides can be stably solubilized in the aqueous precursor solutions. The resultant precursor has a potential sufficiently reducing to form the bismuth-antimony seleno-telluride thermoelectric nanocrystals ($Sb_2Bi_xSe_{3-y}Te_y$, wherein $0 \leq x \leq 2$ and $0 \leq y \leq 3$), directly via the microwave-synthesis technique described herein. In an embodiment where step 114 includes sodium hydroxide as the first solution, the resulting bismuth-antimony seleno-telluride thermoelectric nanocrystals may be doped with sodium up to approximately 10 atomic percent, or more particularly, up to 1 atomic percent.

The method may also include a step 140 of separating the bismuth-antimony seleno-telluride thermoelectric nanocrystals via at least one of filtration or centrifugation methods as known in the art. The pH/pE controlled oxide-based chalcogen precursors has been successfully translated to a kilogram-scale and ton-scale processed on both batch-flow and continuous platforms. There are no synthetic barriers to industrial-scale production of p-type and n-type nanopowder with these extremely favorable properties. At large scales, the chemistry and synthetic procedure described herein is more cost-effective in terms of both energy and materials than traditional ball-milling and crystal growth synthetic techniques for bismuth-antimony seleno-telluride materials.

The methods and process described herein result in bismuth antimony seleno-telluride nanocrystals having a composition of $Sb_{2-x}Bi_xSe_{3-y}Te_y$ where x and y may have values $0 \leq x \leq 2$ and $0 \leq y \leq 3$ and with or without sodium and sulfur doping and with or without excess of one of bismuth, antimony, selenium or tellurium. The nanocrystals may be additionally processed into wafer and ingot forms using methods as known to practitioners of the art, such as by using mechanical pressure and heat. The wafer and ingot forms may have n- or p-type semiconductor character as is the nature of the dominant charge carrier type, n for electron-dominant and p for hole dominant. The wafer and ingot forms may have thermoelectric property values, at room temperature, typical values of the electrical conductivity σ from 20,000-180,000 S/m for both p- and n-type, the Seebeck coefficient α from −250 to −120 µV/K for n-type and 250 to 140 µV/K for p-type. Thermal conductivity, κ values from 0.3 to 1.7 W/mK for both n- and p-types. The temperature-dependent behavior of the thermoelectric properties follow the expected trends of σ decreasing with temperature, α increasing with temperature till a peak is reached dependent on the carrier concentration and doping, and κ showing weak-temperature dependent behavior. The thermoelectric figure of merit, known as ZT and calculated as $ZT = \alpha^2 \sigma T/k$ where T is the temperature, for p-type and n-type $Sb_{2-x}Bi_xSe_{3-y}Te_y$ nanocrystal materials may be from 0.7 to 1.3 at room temperature with optimum maximum from 1.5 to 1.8.

The methods described herein will now be discussed relative to example implementations of the methods. In one example, less than 100 grams (g) of tellurium may be added to 1.0 liter (L) of deionized water to create a first solution. The pH of first solution may be adjusted to 5.0 by undergoing a reaction with 10 g of sodium hydroxide. Once the pH is adjusted, the first solution may undergo a reaction with 3.2 molar equivalents of 35% hydrogen peroxide. The resulting solubilized tellurium precursor may be a completely clear, colorless solution of hydrated telluric acid. The pH of the first solution may then be adjusted to greater than 12.0 by addition of 30 g of sodium hydroxide and the pE may be adjusted to 25 mV by addition of 25 g of sodium borohydride. A second solution may be created to form a pnictogen precursor containing bismuth and antimony by various methods as known to practitioners of the art. The second solution may contain thioglycolic acid. The first and second solutions may be combined to create nanoseeds and subjected to microwave dose of 5 KJ/g to form the bismuth antimony seleno-telluride nanocrystals. The bismuth antimony seleno-telluride nanocrystals may be extracted by filtration.

In another example, 50 grams (g) of tellurium may be added to 0.4 liter (L) of deionized water to create a first solution. 10 g of selenium dioxide may be dissolved in the first solution. The pH of first solution may be adjusted to less than 6.5 by undergoing a reaction with 6 ml of 28% ammonium hydroxide. Once the pH is adjusted, the first solution may undergo a reaction with 150 milliliters (ml) of 30% hydrogen peroxide. The resulting solubilized seleno-tellurium precursor may be a completely clear, colorless solution of hydrated telluric and selenic acid. The pH of the first solution may then be adjusted to greater than 12.0 by addition of 10 to 20 g of potassium hydroxide and the pE may be adjusted to a value between 10 and 35 mV by addition of 12 g of potassium borohydride. A second solution may be created to form a pnictogen precursor containing bismuth and antimony by various methods as known to practitioners of the art. The second solution may contain thioglycolic acid. The first and second solutions may be combined to create nanoseeds and subjected to microwave dose of 10 KJ/g to form the bismuth antimony seleno-telluride nanocrystals. The bismuth antimony seleno-telluride nanocrystals may be extracted by centrifugation.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, illustrations with respect to one or more implementations, alterations and/or modifications can be made to the illustrated examples without departing from the spirit and scope of the appended claims. In addition, while a particular feature may have been disclosed with respect to only one of several implementations, such feature may be combined with one or more other features of the other implementations as may be desired and advantageous for any given or particular function.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A method of synthesizing thermoelectric nanocrystals, the method comprising:
   synthesizing an oxidative chalcogen precursor, the synthesizing including:
   dissolving a chalcogen in acidified deionized water by reacting the chalcogen with a caustic solution in the acidified deionized water to synthesize a first solution, and
   adjusting at least one of: a pH level or a pE level of the first solution;
   exposing the oxidative chalcogen precursor to a pnictogen precursor to create nanoseeds; and
   subjecting the nanoseeds to a microwave thereby synthesizing the thermoelectric nanocrystals.

2. The method of claim 1, wherein the chalcogen includes at least one of: tellurium, selenium, a tellurium oxide, a selenium oxide, tellurous acid, telluric acid, sodium tellurate, selenous acid, or selenic acid.

3. The method of claim 1, wherein the caustic solution includes hydrogen peroxide.

4. The method of claim 1, wherein the adjusting the pH level and the pE level of the first solution includes reacting the first solution with at least one of: sodium hydroxide, potassium hydroxide, a pyridine, an amine, or ammonium hydroxide.

5. The method of claim 1, wherein the pnictogen precursor includes at least one of: bismuth or antimony.

6. The method of claim 1, wherein the subjecting the nanoseeds to the microwave includes subjecting the nanoseeds to a microwave energy dose of approximately equal to or greater than 2.5 kilojoules per gram (KJ/g).

7. The method of claim 1, further comprising separating the thermoelectric nanocrystals via at least one of: filtration or centrifugation.

8. The method of claim 1, wherein the adjusting the pH level of the first solution includes adjusting the pH level to approximately 4.5 to approximately 6.5.

9. The method of claim 1, wherein the adjusting the pE level of the first solution includes adjusting the pE level to approximately 10 millivolts (mV) to approximately 35 mV.

10. The method of claim 1,
    wherein the adjusting the pE level of the first solution includes dissolving a reducing agent by adjusting the pH level to greater than 11 using at least one of: sodium hydroxide, potassium hydroxide, a pyridine, an amine, or ammonium hydroxide; and
    wherein the reducing agent includes at least one of: sodium hydride, lithium hydride, aluminum hydride, sodium borohydride, potassium borohydride, lithium borohydride or aluminum borohydride.

11. The method of claim 1, wherein the thermoelectric nanocrystals have a particle size of approximately 5 nanometers (nm) to approximately 100 nm.

12. The method of claim 1, wherein the dissolving the chalcogen in acidified deionized water by reacting the chalcogen with the caustic solution in the acidified deionized water to synthesize the first solution includes providing 20% excess of the caustic solution relative to the first solution.

13. The method of claim 1, wherein the thermoelectric nanocrystals include $Sb_{2-x}Bi_xSe_{3-y}Te_y$, wherein $0 \leq x \leq 2$ and $0 \leq y \leq 3$.

14. The method of claim 1, wherein the thermoelectric nanocrystals are doped with sodium up to 1 atomic percent.

15. A method of synthesizing thermoelectric nanocrystals, the method comprising:
    synthesizing an oxidative chalcogen precursor, the synthesizing including:
    dissolving a chalcogen in acidified deionized water by reacting the chalcogen with hydrogen peroxide in the acidified deionized water to synthesize a first solution, the chalcogen including at least one of: tellurium, selenium a tellurium oxide, a selenium oxide, tellurous acid, telluric acid, sodium tellurate, selenous acid, or selenic acid; and
    adjusting at least one of: a pH level or a pE level of the first solution;
    exposing the oxidative chalcogen precursor to a pnictogen precursor to create nanoseeds; and
    subjecting the nanoseeds to a microwave thereby synthesizing the thermoelectric nanocrystals.

16. The method of claim 15, wherein the adjusting the pH level and the pE level of the first solution includes reacting the first solution with at least one of: sodium hydroxide, potassium hydroxide, a pyridine, an amine, or ammonium hydroxide.

17. The method of claim 15, wherein the pnictogen precursor includes at least one of: bismuth or antimony.

18. The method of claim 15, wherein the subjecting the nanoseeds to the microwave includes subjecting the nanoseeds to a microwave energy dose of approximately equal to or greater than 2.5 kilojoules per gram (KJ/g).

19. The method of claim 15, further comprising separating the thermoelectric nanocrystals via at least one of: filtration or centrifugation.

20. The method of claim 15, wherein the adjusting the pH level of the first solution includes adjusting the pH level to approximately 4.5 to approximately 6.5.

21. The method of claim 15, wherein the adjusting the pE level of the first solution includes adjusting the pE level to approximately 10 millivolts (mV) to approximately 35 mV.

22. The method of claim 15,
    wherein the adjusting the pE level of the first solution includes dissolving a reducing agent by adjusting the pH level to greater than 11 using at least one of: sodium hydroxide, potassium hydroxide, a pyridine, an amine, or ammonium hydroxide; and
    wherein the reducing agent includes at least one of: sodium hydride, lithium hydride, aluminum hydride, sodium borohydride, potassium borohydride, lithium borohydride or aluminum borohydride.

23. The method of claim 15, wherein the thermoelectric nanocrystals include $Sb_{2-x}Bi_xSe_{3-y}Te_y$, wherein $0 \leq x \leq 2$ and $0 \leq y \leq 3$.

24. The method of claim 15, wherein the thermoelectric nanocrystals are doped with sodium up to 1 atomic percent.

* * * * *